US011705339B2

(12) United States Patent
Takahashi et al.

(10) Patent No.: US 11,705,339 B2
(45) Date of Patent: Jul. 18, 2023

(54) ETCHING METHOD AND PLASMA PROCESSING APPARATUS

(71) Applicant: Tokyo Electron Limited, Tokyo (JP)

(72) Inventors: Shingo Takahashi, Miyagi (JP); Shogo Yamaya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/474,120

(22) Filed: Sep. 14, 2021

(65) Prior Publication Data

US 2022/0084837 A1 Mar. 17, 2022

(30) Foreign Application Priority Data

Sep. 16, 2020 (JP) .................................. 2020-155518
Aug. 5, 2021 (JP) .................................. 2021-128960

(51) Int. Cl.
*H01L 21/311* (2006.01)
*H01L 21/3065* (2006.01)
*H01J 37/32* (2006.01)

(52) U.S. Cl.
CPC .. *H01L 21/31116* (2013.01); *H01J 37/32146* (2013.01); *H01J 37/32449* (2013.01); *H01L 21/3065* (2013.01); *H01L 21/31144* (2013.01); *H01J 2237/334* (2013.01)

(58) Field of Classification Search
None
See application file for complete search history.

(56) References Cited

U.S. PATENT DOCUMENTS

2012/0052689 A1* 3/2012 Tokashiki ......... H01L 21/31116
156/345.28

FOREIGN PATENT DOCUMENTS

JP 2009-187975 A 8/2009

* cited by examiner

*Primary Examiner* — Roberts P Culbert
(74) *Attorney, Agent, or Firm* — Studebaker & Brackett PC

(57) ABSTRACT

A disclosed etching method includes (a) generating plasma of a processing gas in a chamber of a plasma processing apparatus. The plasma is generated in a state where a substrate is placed on a substrate support having a lower electrode in the chamber. The substrate has a film and a mask. The mask is provided on the film. The etching method further includes (b) etching the film by supplying ions from the plasma to the substrate by periodically applying a pulse of a voltage to a lower electrode. In the operation (b), a level of a voltage of the pulse is changed at least once such that an absolute value of a negative potential of the substrate has a tendency to increase according to progress of etching of the film.

14 Claims, 10 Drawing Sheets

ETCHING METHOD AND PLASMA PROCESSING APPARATUS

CROSS-REFERENCE TO RELATED APPLICATIONS

This application is based on and claims the benefit of priority from Japanese Patent Application Nos. 2020-155518 filed on Sep. 16, 2020, and 2021-128960 filed on Aug. 5, 2021, the entire contents of which are incorporated herein by reference.

FIELD

Exemplary embodiments of the present disclosure relate to an etching method and a plasma processing apparatus.

BACKGROUND

A plasma processing apparatus is used in plasma processing on a substrate. The plasma processing apparatus is provided with a chamber and a substrate holding electrode. The substrate holding electrode is provided in the chamber. The substrate holding electrode holds the substrate placed on the main surface thereof. A type of such a plasma processing apparatus is disclosed in Japanese Unexamined Patent Publication No. 2009-187975.

The plasma processing apparatus disclosed in Japanese Unexamined Patent Publication No. 2009-187975 is further provided with a radio frequency generation device and a DC negative pulse generation device. The radio frequency generation device applies a radio frequency voltage to the substrate holding electrode. The radio frequency generation device alternately switches between ON and OFF of the radio frequency voltage. The DC negative pulse generation device applies a DC negative pulse voltage to the substrate holding electrode according to the timing of ON and OFF of the radio frequency voltage. In the plasma processing apparatus disclosed in Japanese Unexamined Patent Publication No. 2009-187975, the energy of ions that are supplied to the substrate becomes the maximum when the DC negative pulse voltage is applied to the substrate holding electrode. The energy of the ions that are supplied to the substrate becomes the minimum when the DC negative pulse voltage is not applied to the substrate.

SUMMARY

In an exemplary embodiment, an etching method is provided. The etching method includes placing a substrate on a substrate support provided in a chamber of a plasma processing apparatus. The substrate has a film and a mask. The mask is provided on the film. The etching method further includes etching the film of the substrate placed on the substrate support. The etching the film includes (a) generating plasma of a processing gas in the chamber. The etching the film further includes (b) etching the film by supplying ions from the plasma to the substrate by periodically applying a pulse of a voltage to a lower electrode in the substrate support. In the operation (b), a level of a voltage of the pulse is changed at least once such that an absolute value of a negative potential of the substrate has a tendency to increase according to progress of etching of the film.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
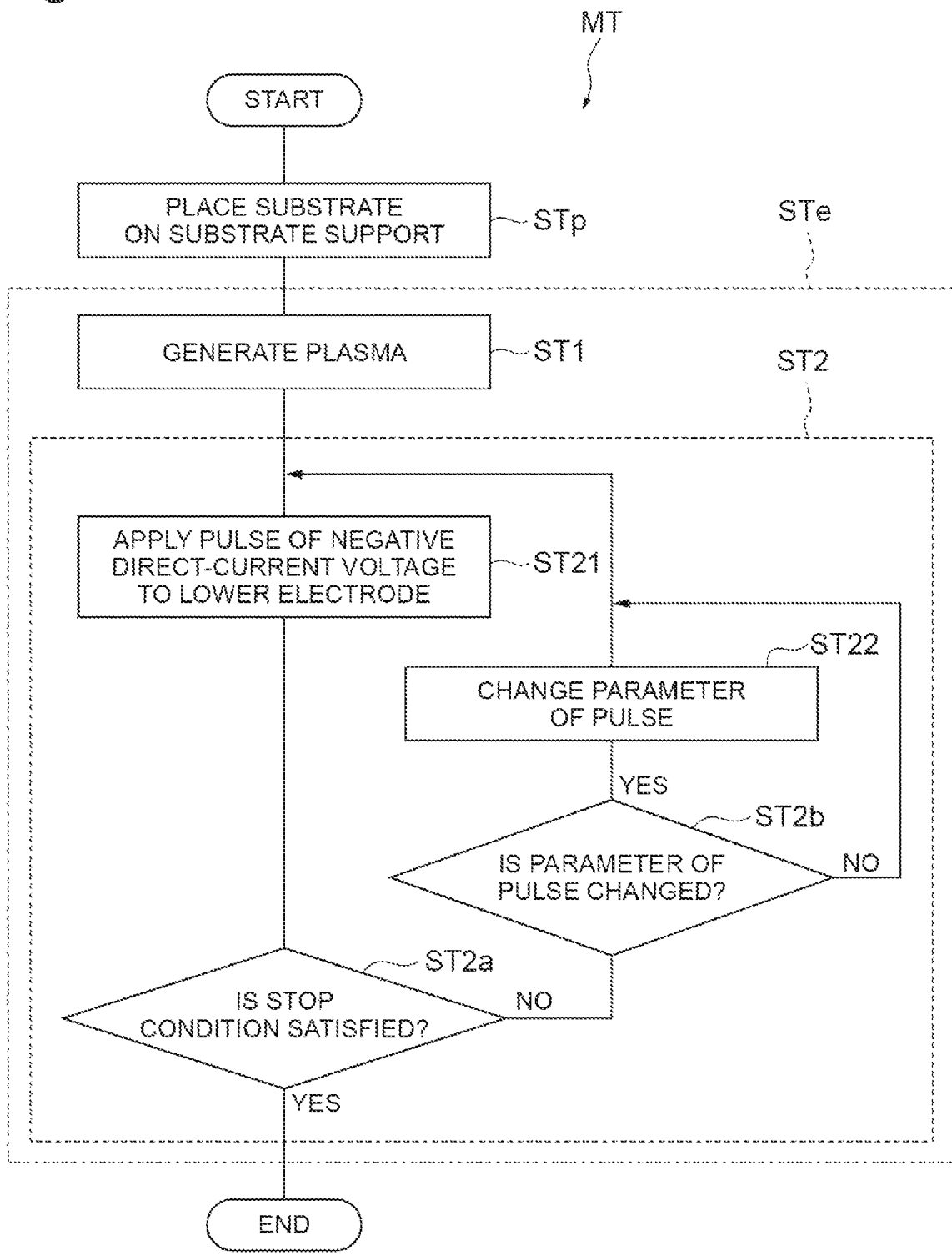
FIG. 1 is a flow chart of an etching method according to an exemplary embodiment.

Hereinafter, various exemplary embodiments will be described.

In an exemplary embodiment, an etching method is provided. The etching method includes placing a substrate on a substrate support provided in a chamber of a plasma processing apparatus. The substrate has a film and a mask. The mask is provided on the film. The etching method further includes etching the film of the substrate placed on the substrate support. The etching the film includes (a) generating plasma of a processing gas in the chamber. The etching the film further includes (b) etching the film by supplying ions from the plasma to the substrate by periodically applying a pulse of a voltage to a lower electrode in the substrate support. In the operation (b), a level of a voltage of the pulse is changed at least once such that an absolute value of a negative potential of the substrate has a tendency to increase according to progress of etching of the film.

In the above embodiment, when the depth of the opening formed in the film of the substrate is shallow, since the absolute value of the negative potential of the substrate is relatively small, the film is etched by using ions having relatively low energy. Further, when the depth of the opening formed in the film of the substrate is deep, since the absolute value of the negative potential of the substrate is relatively large, the film is etched by using ions having relatively high energy. Since the ions having relatively low energy, which are used when the depth of the opening is shallow, suppress etching of the mask, the selectivity of etching of the film with respect to etching of the mask is enhanced. Further, the ions having relatively low energy, which are used when the depth of the opening is shallow, can suppress deterioration in the verticality of the opening that is formed in the film. Further, the ions having relatively high energy, which are used when the depth of the opening is deep, enhance the etching rate of the film, thereby enhancing the selectivity of the etching of the film with respect to the etching of the mask. Further, the ions having relatively high energy, which are used when the depth of the opening is deep, enhance the verticality of the opening that is formed in the film. Therefore, according to the above embodiment, the verticality of the opening that is formed in the film and the selectivity of the etching of the film with respect to the etching of the mask are enhanced.

In an exemplary embodiment, the pulse may be a pulse of a negative voltage or a pulse of a negative direct-current voltage. In the operation (b), an absolute value of the voltage of the pulse may be increased at least once such that the absolute value of the voltage of the pulse has a tendency to increase according to the progress of the etching of the film.

In the above embodiment, when the depth of the opening that is formed in the film of the substrate is shallow, a pulse of a negative voltage having a relatively low absolute value is supplied to the lower electrode, and the film is etched by using ions having relatively low energy. Further, when the depth of the opening that is formed in the film of the substrate is deep, a pulse of a negative voltage having a relatively high absolute value is supplied to the lower electrode, and the film is etched by using ions having relatively high energy.

In an exemplary embodiment, a duty ratio of the pulse may be set to 20% or less in the operation (b).

In an exemplary embodiment, a duty ratio of the pulse may be decreased at least once to have a tendency to decrease according to the progress of the etching of the film, in the operation (b). In an exemplary embodiment, the duty ratio of the pulse may be decreased to have a ratio of 15% or more and 20% or less, in the operation (b). According to the embodiment, it becomes possible to further suppress the etching of the mask while suppressing a decrease in the etching rate of the film.

In an exemplary embodiment, the duty ratio of the pulse may be stepwise or gradually reduced in the operation (b).

In an exemplary embodiment, the level of the voltage of the pulse may be stepwise or gradually changed in the operation (b).

An etching method according to another exemplary embodiment includes placing a substrate on a substrate support provided in a chamber of a plasma processing apparatus. The substrate has a film and a mask. The mask is provided on the film. The etching method further includes etching the film of the substrate placed on the substrate support. The etching the film includes (a) generating plasma of a processing gas in the chamber of the plasma processing apparatus. The etching the film further includes (b) etching the film by periodically applying a pulse of a voltage to a lower electrode in the substrate support to supply ions from the plasma to the substrate. In the operation (b), a duty ratio of the pulse is decreased at least once to have a tendency to decrease according to progress of the etching of the film. In an exemplary embodiment, the pulse may be a pulse of a negative voltage or a pulse of a negative direct-current voltage.

In an exemplary embodiment, the film may include a silicon-containing film. The film may include a silicon-containing dielectric film. The film may include a silicon oxide film. The film may further include a silicon nitride film. The mask may be formed of polycrystalline silicon, In still another exemplary embodiment, a plasma processing apparatus is provided. The plasma processing apparatus is provided with a chamber, a substrate support, a gas supply, a plasma generator, a bias power source, and a controller. The substrate support has a lower electrode and provided in the chamber. The gas supply is configured to supply a processing gas into the chamber. The plasma generator is configured to generate plasma from a gas in the chamber. The bias power source is electrically connected to the lower electrode and configured to periodically generate a pulse of a voltage. The controller is configured to (a) control the gas supply and the plasma generator to generate plasma of the processing gas in the chamber. The controller is configured to (b) control the bias power source to periodically apply the pulse to the lower electrode to supply ions from the plasma to a substrate on the substrate support, thereby etching a film of the substrate. In the control of the (b), the bias power source is controlled to change a level of a voltage of the pulse at least once such that an absolute value of a negative potential of the substrate has a tendency to increase according to progress of etching of the film. In an exemplary embodiment, the bias power source may be configured to generate, as the pulse, a pulse of a negative voltage or a pulse of a negative direct-current voltage.

Hereinafter, various exemplary embodiments will be described in detail with reference to the drawings. In the drawings, the same or equivalent portions are denoted by the same reference symbols.

FIG. 1 is a flow chart of an etching method according to an exemplary embodiment. The etching method (hereinafter referred to as a "method MT") shown in FIG. 1 is performed in order to etch a film of a substrate.

Figure 2:
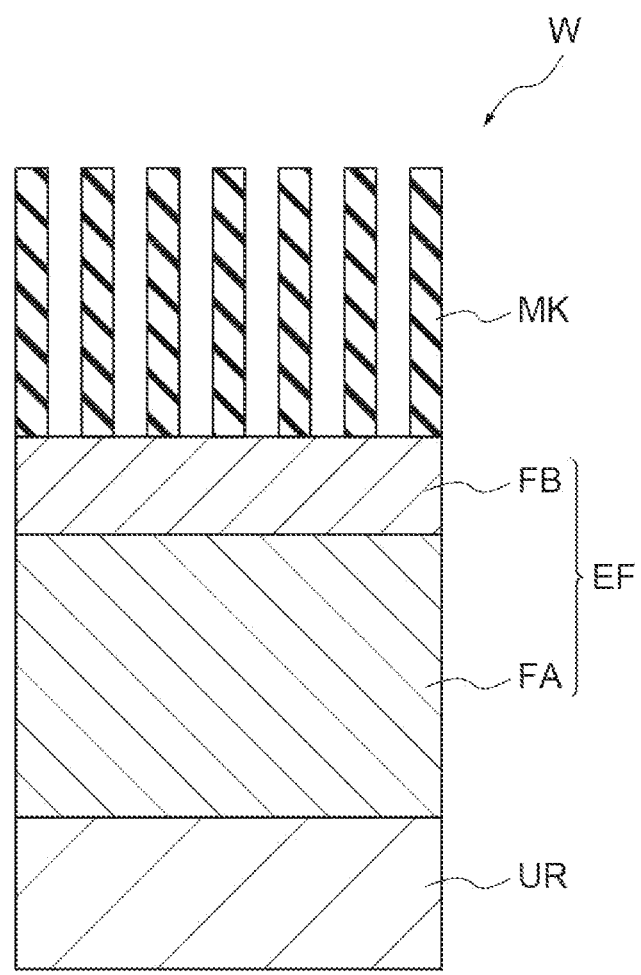
FIG. 2 is a partially enlarged sectional view of a substrate of an example to which the etching method shown in FIG. 1 is applied.

FIG. 2 is a partially enlarged sectional view of a substrate of an example to which the etching method shown in FIG. 1 is applied. A substrate W shown in FIG. 2 has a film EF and a mask MK. The film EF is etched in the method MT. The film EF may include a silicon-containing film and/or a silicon-containing dielectric film. The film EF may include a silicon oxide film and/or a silicon nitride film. The mask MK is provided on the film EF. The mask MK has a pattern that is transferred to the film EF. The mask MK may be formed of any material as long as the film EF is selectively etched with respect to the mask MK. In a case where the film EF includes a silicon oxide film and/or a silicon nitride film, the mask MK may be formed of polycrystalline silicon.

The film EF may be a single-layer film or may be a multi-layer film. In an embodiment, the film EF may include a film FA and a film FB. The film FB is provided on the film FA, and the mask MK is provided on the film FB. The film FA may be a silicon oxide film, and the film FB may be a silicon nitride film. In an embodiment, the substrate W may further have an underlying region UR. The film EF may be provided on the underlying region UR.

Figure 3:
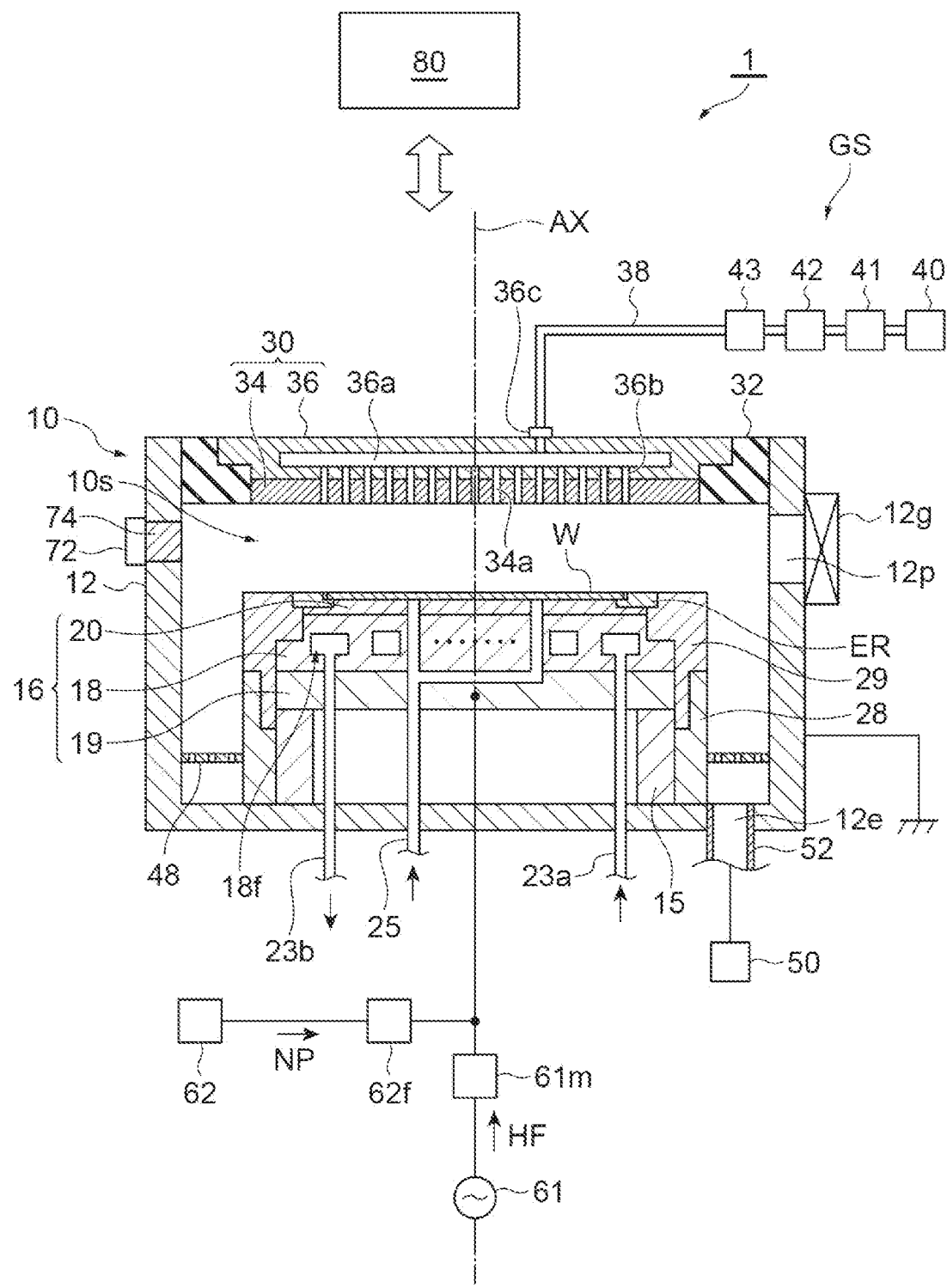
FIG. 3 schematically illustrates a plasma processing apparatus according to an exemplary embodiment.

In the method MT, a plasma processing apparatus is used for etching of the film of the substrate. FIG. 3 is a diagram schematically showing a plasma processing apparatus according to an exemplary embodiment. In the method MT, a plasma processing apparatus 1 shown in FIG. 3 may be used. The plasma processing apparatus 1 is a capacitively coupled plasma processing apparatus. The plasma processing apparatus 1 is provided with a chamber 10. The chamber 10 provides an internal space 10s therein. The central axis of the chamber 10 is an axis AX which extends in the vertical direction.

In an embodiment, the chamber 10 may include a chamber body 12. The chamber body 12 has a substantially cylindrical shape. The internal space 10s is provided in the chamber body 12. The chamber body 12 is formed of, for example, aluminum. The chamber body 12 is electrically grounded. A film having corrosion resistance is provided on the inner wall surface of the chamber body 12. The film having corrosion resistance may be a film formed of ceramic such as aluminum oxide or yttrium oxide.

A passage 12p is provided in the side wall of the chamber body 12. The substrate W passes through the passage 12p when it is transferred between the internal space 10s and the outside of the chamber 10. The passage 12p is made to be able to be opened and closed by a gate valve 12g. The gate valve 12g is provided along the side wall of the chamber body 12.

The plasma processing apparatus 1 is further provided with a substrate support 16. The substrate support 16 is configured to support the substrate W in the chamber 10. The substrate W may have a substantially disk shape. The substrate support 16 may be supported by a support 15. The support 15 extends upward from a bottom portion of the chamber body 12. The support 15 has a substantially cylindrical shape. The support 15 is formed of an insulating material such as quartz.

The substrate support 16 includes a lower electrode 18. The substrate support 16 may further include an electrostatic chuck 20. The substrate support 16 may further include an electrode plate 19. The electrode plate 19 is formed of a conductive material such as aluminum. The electrode plate 19 has a substantially disk shape, and the central axis thereof is the axis AX. The lower electrode 18 is provided on the electrode plate 19. The lower electrode 18 is formed of a conductive material such as aluminum. The lower electrode 18 has a substantially disk shape, and the central axis thereof is the axis AX. The lower electrode 18 is electrically connected to the electrode plate 19.

The lower electrode 18 provides a flow path 18f therein. The flow path 18f is connected to a supply device for a heat exchange medium (for example, a chiller unit). The supply device is provided outside the chamber 10. The flow path 18f receives the heat exchange medium that is supplied from the supply device through a pipe 23a. The heat exchange medium flows through the flow path 18f and is then returned to the supply device through a pipe 23b. The supply device configures a temperature adjusting mechanism of the plasma processing apparatus 1.

The electrostatic chuck 20 is provided on the lower electrode 18. The substrate W is placed on the upper surface of the electrostatic chuck 20. The electrostatic chuck 20 has a main body and an electrode. The main body is formed of a dielectric. Each of the electrostatic chuck 20 and the main body thereof has a substantially disk shape, and the central axis thereof is the axis AX. The electrode is a film having electrical conductivity and is provided in the main body. The electrode is connected to a direct-current power source through a switch. When the voltage from the direct-current power source is applied to the electrode, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may support an edge ring ER that is mounted on a peripheral edge portion thereof. The edge ring ER may be formed of silicon, silicon carbide, or quartz. The substrate W is disposed on the electrostatic chuck 20 and in a region surrounded by the edge ring ER.

The plasma processing apparatus 1 may be further provided with a gas supply line 25. The gas supply line 25 supplies a heat transfer gas (for example, a He gas) from a gas supply mechanism to a gap between the upper surface of the electrostatic chuck 20 and the rear surface (lower surface) of the substrate W.

The plasma processing apparatus 1 may be further provided with a tubular part 28 and an insulating part 29. The tubular part 28 extends upward from the bottom portion of the chamber body 12. The tubular part 28 extends along the outer periphery of the support 15. The tubular part 28 is formed of a conductive material and has a substantially cylindrical shape. The tubular part 28 is electrically grounded. The insulating part 29 is provided on the tubular part 28. The insulating part 29 is formed of a material having insulation properties. The insulating part 29 is formed of ceramic such as quartz, for example. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing apparatus 1 is further provided with an upper electrode 30. The upper electrode 30 is provided above the substrate support 16. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 may be formed of a low resistance conductor or semiconductor with low Joule heat. In an embodiment, the ceiling plate 34 is formed of silicon. A plurality of gas discharge holes 34a are provided in the ceiling plate 34. The plurality of gas discharge holes 34a penetrate the ceiling plate 34 in a plate thickness direction thereof.

The support 36 detachably supports the ceiling plate 34. The support 36 is formed of a conductive material such as aluminum. The support 36 provides a gas diffusion chamber 36a therein. The support 36 is further provided with a plurality of gas holes 36b. The plurality of gas holes 36b extend downward from the gas diffusion chamber 36a. The plurality of gas holes 36b communicate with the plurality of gas discharge holes 34a, respectively. The support 36 is further provided with a gas introduction port 36c. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply GS. The gas source group 40 includes a plurality of gas sources. The plurality of gas sources of the gas source group 40 include sources of a plurality of gases. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

The plasma processing apparatus 1 may be further provided with a baffle member 48. The baffle member 48 is provided between the tubular part 28 and the side wall of the chamber body 12. The baffle member 48 may be a plate-shaped member. The baffle member 48 is configured, for example, by forming a film having corrosion resistance on the surface of a member made of aluminum. The film having corrosion resistance may be a film formed of ceramic such as yttrium oxide. A plurality of through-holes are provided in the baffle member 48. An exhaust port 12e is provided below the baffle member 48 and in the bottom portion of the chamber body 12. An exhaust device 50 is connected to the exhaust port 12e through an exhaust pipe 52. The exhaust device 50 has a pressure adjusting valve, and a vacuum pump such as a turbo molecular pump.

The plasma processing apparatus 1 is further provided with a radio frequency power source 61. The radio frequency power source 61 is a power source that generates radio frequency power HF for plasma generation. The radio frequency power HF has a first frequency. The first frequency is, for example, a frequency in the range of 27 to 100 MHz. In an example, the first frequency is 40 MHz. The radio frequency power source 61 is connected to the lower electrode 18 through a matcher 61m and the electrode plate 19 in order to supply the radio frequency power HF to the lower electrode 18. The matcher 61m has a matching circuit. The matching circuit of the matcher 61m has variable impedance. The impedance of the matching circuit of the matcher 61m is adjusted to reduce the reflection from a load of the radio frequency power source 61. The radio frequency power source 61 does not need to be electrically connected to the lower electrode 18, and may be connected to the upper electrode 30 through the matcher 61m. The radio frequency power source 61 configures a plasma generator in an embodiment.

The plasma processing apparatus 1 is further provided with a bias power source 62. The bias power source 62 is connected to the lower electrode 18 through the electrode plate 19. The bias power source 62 is configured to periodically generate a pulse NP of a voltage. The polarity of the voltage of the pulse NP may be either negative or positive as long as the potential of the substrate W that is set by applying the pulse NP to the lower electrode 18 is a negative potential. In an embodiment, the bias power source 62 generates a pulse of a negative voltage or a pulse of a negative direct-current voltage as the pulse NP of the voltage. The cycle of the pulse NP, that is, a time interval in which the pulse NP is generated, has a time length that is the reciprocal of a second frequency. The second frequency is lower than the first frequency. The second frequency is, for example, a frequency in the range of 1 kHz to 27 MHz. In an example, the second frequency is 400 kHz. The ratio of a time during which the pulse NP is applied to the lower electrode 18 in the time length of one cycle, that is, the duty ratio, may be 20% or less.

In an embodiment, the bias power source 62 may be connected to the lower electrode 18 through a filter 62f. The filter 62f is a low-pass filter and reduces the radio frequency power HF that can flow into the bias power source 62.

In an embodiment, the plasma processing apparatus 1 may be further provided with an analyzer 72. The analyzer 72 performs spectroscopic analysis of the plasma generated in the chamber 10. For example, the analyzer 72 observes plasma emission through a window 74 provided in the side wall of the chamber body 12. The window 74 is made of an optically transparent member such as quartz.

The plasma processing apparatus 1 is further provided with a controller 80. The controller 80 is a computer which includes a processor, a storage device, an input device, a display device, and the like, and controls each part of the plasma processing apparatus 1. Specifically, the controller 80 executes a control program stored in the storage device and controls each part of the plasma processing apparatus 1, based on recipe data stored in the storage device. The controller 80 controls, for example, the gas supply GS, the exhaust device 50, the radio frequency power source 61, the bias power source 62, and the like. A process designated by the recipe data, for example, the method MT, is performed in the plasma processing apparatus 1 under the control by the controller 80.

Hereinafter, the method MT will be described with reference to FIG. 1 again. In the following description, the method MT will be described by taking a case where the method MT is applied to the substrate W shown in FIG. 2 by using the plasma processing apparatus 1, as an example. The substrate to which the method MT is applied may be a substrate different from the substrate shown in FIG. 2. Further, in the method MT, a plasma processing apparatus different from the plasma processing apparatus 1 may be used.

As shown in FIG. 1, the method MT includes step STp and step STe. In step STp, the substrate W is placed on the substrate support 16. Step STe is performed in a state where the substrate W is placed on the substrate support 16. In step STe, the film EF is etched. Step STe includes step ST1 and step ST2. Steps ST1 and ST2 are performed in a state where the substrate W is placed on the substrate support 16 the chamber 10.

In step ST1, plasma of the processing gas is generated in the chamber of the plasma processing apparatus. The processing gas is selected according to the film type of the film EF to be etched. In a case where the film EF includes a silicon oxide film and/or a silicon nitride film, the processing gas may include a fluorocarbon gas. The processing gas may include at least one of a rare gas such as argon gas, an oxygen gas such as $O_2$ gas, and another fluorine-containing gas. In step ST1, the processing gas is excited in the chamber by the energy that is supplied by the plasma generator. As a result, plasma is generated in the chamber.

In a case where the plasma processing apparatus 1 is used, the controller 80 controls the gas supply GS to supply the processing gas into the chamber 10 in step ST1. Further, the controller 80 controls the exhaust device 50 to set the pressure in the chamber 10 to a designated pressure. Further, the controller 80 controls the radio frequency power source 61 to supply the radio frequency power HF. Under the control of the controller 80, plasma is generated from the processing gas in the chamber 10. The frequency of the radio frequency power HF during a period in which step STe is performed may be constant. The frequency of the radio frequency power HF during period in which step STe is performed may be, for example, 40 MHz.

Step ST2 is performed when the plasma generated in step ST1 is present in the chamber. Step ST2 may be performed at the same time as the generation of the plasma in step ST1. Step ST2 includes step ST21. In step ST21, the pulse NP is applied to the lower electrode of the substrate support. Step ST21 is periodically repeated. That is, in step ST2, the pulse NP is periodically applied to the lower electrode of the substrate support. In step ST2, the ions from the plasma are supplied to the substrate, whereby the film EF is etched.

In a case where the plasma processing apparatus 1 is used, the controller 80 controls the bias power source 62 to periodically apply the pulse NP to the lower electrode 18 in step ST2. A cycle, that is, a time interval, in which the pulse NP is applied to the lower electrode 18 has a time length that is the reciprocal of the second frequency. As described above, the second frequency is, for example, a frequency in the range of 1 kHz to 27 MHz. In an example, the second frequency is 400 kHz. The ratio of a time during which the pulse NP is applied to the lower electrode 18 in the time length of one cycle, that is, the duty ratio, may be 20% or less.

In step ST2, each of one or more parameters of the pulse NP is changed according to the progress of etching of the film EF. Each of the one or more parameters of the pulse NP is changed at least once during the repetition of step ST21. Each of the one or more parameters of the pulse NP may be stepwise or gradually changed during the repetition of step ST21. The one or more parameters of the pulse NP may include at least one of the level of the voltage of the pulse NP and the duty ratio of the pulse NP.

In step ST2, the level of the voltage of the pulse NP may be changed at least once such that the absolute value of the negative potential of the substrate W has a tendency to increase according to the progress of the etching of the film EF. In step ST2, the level of the voltage of the pulse NP may be stepwise or gradually changed such that the absolute value of the negative potential of the substrate W has a tendency to increase according to the progress of the etching of the film EF.

Figure 4B:
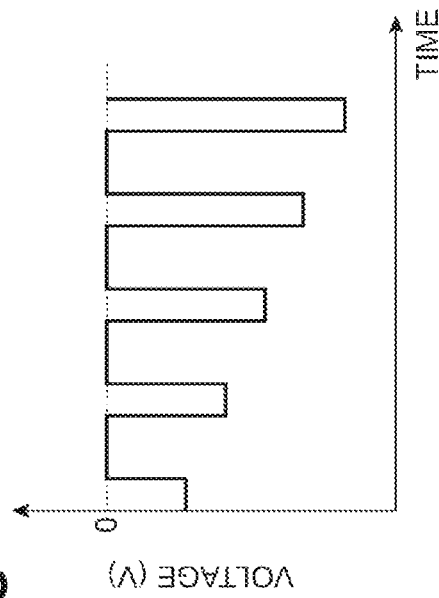
FIGS. 4A to 4D illustrate examples of a temporal change of a pulse of a voltage.
Figure 4D:
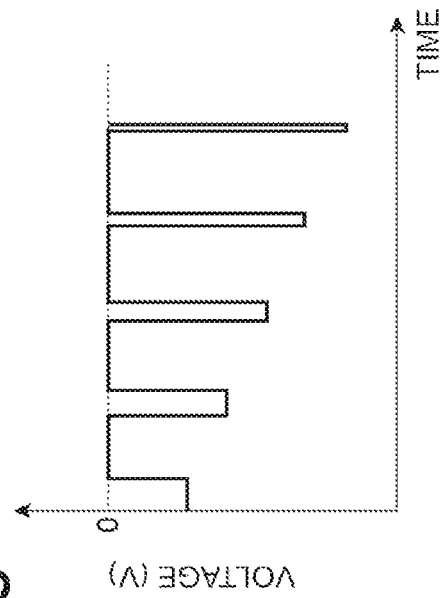
Figure 4A:
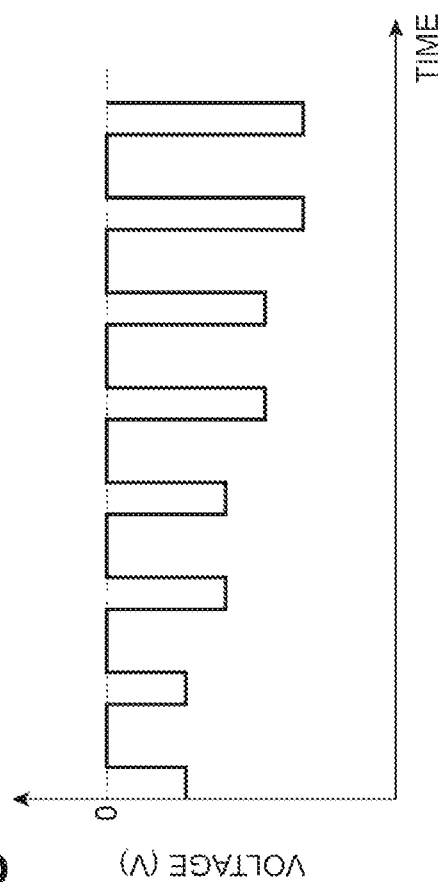

FIGS. 4A to 4D are diagrams showing examples of a temporal change of the pulse of the voltage. In FIG. 4A, a stepwise change in the level of the voltage of the pulse NP is shown. As shown in FIG. 4A, in step ST2, the level of the voltage of the pulse NP may be changed every two or more cycles. In FIG. 4B, a gradual change in the level of the voltage of the pulse NP is shown. As shown in FIG. 4B, in step ST2, the level of the voltage of the pulse NP may be changed for each cycle.

In an embodiment, in step ST2, the absolute value of the negative voltage or the negative direct-current voltage of the pulse NP may be increased at least once to have a tendency to increase according to the progress of the etching of the film EF. In step ST2, the absolute value of the negative voltage or the negative direct-current voltage of the pulse NP may be stepwise or gradually increased to have a tendency to increase according to the progress of the etching of the film EF.

Figure 4C:
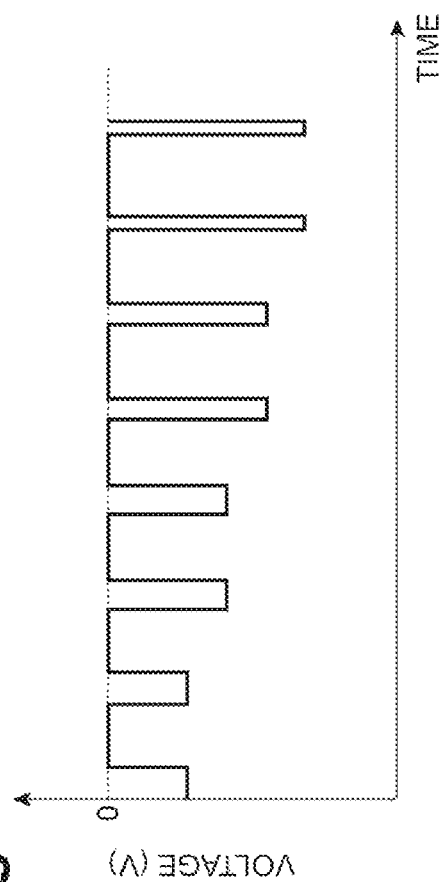

In step ST2, the duty ratio of the pulse NP may be decreased at least once to have a tendency to decrease according to the progress of the etching of the film EF. In step ST2, the duty ratio of the pulse NP may be stepwise or gradually decreased to have a tendency to decrease according to the progress of the etching of the film EF. In FIG. 4C, a stepwise decrease in the duty ratio of the pulse NP is shown. As shown in FIG. 4C, in step ST2, the duty ratio of the pulse NP may be reduced every two or more cycles. In FIG. 4D, a gradual change in the duty ratio of the pulse NP is shown. As shown in FIG. 4D, in step ST2, the duty ratio of the pulse NP may be reduced for each cycle.

In an embodiment, in step ST2, the duty ratio of the pulse NP may be reduced to have a ratio in the range of 15% or more and 20% or less. During a period in which step ST2 is performed, the absolute value of the voltage of the pulse NP and the duty ratio of the pulse NP may be changed at the same time, or may be changed at different timings.

In step ST2, the controller 80 controls the bias power source 62 to change each of the one or more parameters of the pulse NP at least once according to the progress of the etching of the film EF. In step ST2, the controller 80 may control the bias power source 62 to change the level of the voltage of the pulse NP at least once such that the absolute value of the negative potential of the substrate W has a tendency to increase according to the progress of the etching of the film EF. In a case where the voltage of the pulse NP has a negative polarity, in step ST2, the controller 80 may control the bias power source 62 to increase the absolute value of the voltage of the pulse NP at least once such that the absolute value of the voltage of the pulse NP has a tendency to increase according to the progress of the etching of the film EF. In step ST2, the controller 80 may control the bias power source 62 to decrease the duty ratio of the pulse NP at least once such that the duty ratio of the pulse NP has a tendency to decrease according to the progress of the etching of the film EF.

In an embodiment, step ST2 may include step ST22 in addition to step ST21. Step ST2 may further include step ST2a and step ST2b. In step ST2a, it is determined whether or not a stop condition is satisfied. The stop condition is determined to be satisfied, for example, in a case where the number of repetitions of step ST21 reaches a predetermined number of times. The predetermined number of times may be designated as a part of the recipe data. When it is determined in step ST2a that the stop condition is not satisfied, the determination in step ST2b is then performed.

In step ST2b, it is determined whether or not any of the one or more parameters of the pulse NP has to be changed. A timing of a change of each of the one or more parameters of the pulse NP may be specified as a part of the recipe data. When it is determined in step ST2b that none of the one or more parameters of the pulse NP has to be changed, the processing proceeds to step ST21.

On the other hand, in a case where it is determined in step ST2b that any of the one or more parameters of the pulse NP has to be changed, the processing proceeds to step ST22. In an example, in a case where the number of times in which the pulse NP of the same level continues to be output (that is, the number of consecutive cycles in which the pulse NP of the same level is output) has reached a predetermined number of times, the processing proceeds to step ST22. In another example, in a case where, from the emission intensity of each of the lights of a plurality of wavelengths, which are acquired by the analyzer 72, it is determined that the type of the film that is etched has been switched, the processing proceeds to step ST22. For example, in a case where the film EF includes a laminate of a silicon oxide film and a silicon nitride film, when the silicon oxide film is etched, the emission intensity at a wavelength of 483 nm is large, and when the silicon nitride film is etched, the emission intensity at the wavelength of 387 nm is large. In a case where the film EF includes a laminate of a silicon oxide film and a silicon nitride film, a timing at which the type of the film that is etched is switched is identified by observing the emission intensities of the lights of these wavelengths, and step ST22 is performed at such a timing.

In step ST22, the parameter of the pulse NP to be changed is changed. In a case where the level of the voltage of the pulse NP is the parameter to be changed, the level is changed in step ST22. For example, in a case where the voltage of the pulse NP has a negative polarity, the absolute value of the voltage of the pulse NP is increased in step ST22. In a case where the duty ratio of the pulse NP is the parameter to be changed, the duty ratio is reduced in step ST22. The change value of the parameter to be changed, of the pulse NP, may be specified as a part of the recipe data. After step ST22, the processing proceeds to step ST21.

Figure 5:
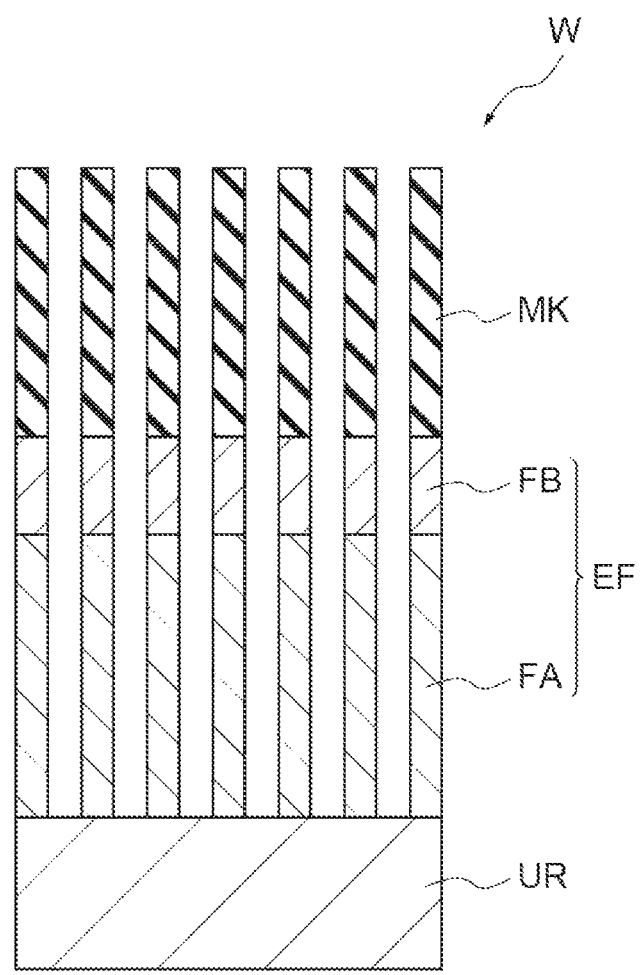
FIG. 5 is a partially enlarged sectional view of a substrate of an example to which the etching method shown in FIG. 1 is applied.

After step ST21 is periodically repeated, when it is determined in step ST2a that the stop condition is satisfied, step ST2 ends and the method MT ends. FIG. 5 is a partially enlarged sectional view of a substrate of an example to which the etching method shown in FIG. 1 is applied. In step ST2, the film EF is etched to transfer the pattern of the mask MK thereto. As a result, an opening is formed in the film EF. In step ST2, as shown in FIG. 5, the film EF may be etched to partially expose the underlying region UR.

In the method MT, when the depth of the opening formed in the film EF of the substrate W is shallow, since the absolute value of the negative potential of the substrate W is relatively small, the film EF is etched by using ions having relatively low energy. Further, when the depth of the opening formed in the film EF of the substrate W is deep, since the absolute value of the negative potential of the substrate W is relatively large, the film EF is etched by using ions having relatively high energy. The ions having relatively low energy, which are used when the depth of the opening is shallow, suppress etching of the mask MK, and therefore, the selectivity of the etching of the film EF with respect to the etching of the mask MK is enhanced. Further, the ions having relatively low energy, which are used when the depth of the opening is shallow, can suppress deterioration in the verticality of the opening that is formed in the film EF. Further, the ions having relatively high energy, which are used when the depth of the opening is deep, enhance the etching rate of the film EF, thereby enhancing the selectivity of the etching of the film EF with respect to the etching of the mask MK. Further, the ions having relatively high energy, which are used when the depth of the opening is deep, enhance the verticality of the opening which is formed in the film EF. Therefore, according to the method MT, the verticality of the opening that is formed in the film EF and the selectivity of the etching of the film EF with respect to the etching of the mask MK are enhanced.

In an embodiment, the voltage of the pulse NP that is periodically applied has a negative polarity. In a case where the absolute value of the voltage of the pulse NP that is periodically applied has a tendency to increase, when the depth of the opening formed in the film EF of the substrate W is shallow, the pulse NP of a negative voltage having a relatively low absolute value is supplied to the lower electrode 18. Therefore, the film EF is etched by using the ions having relatively low energy. Further, when the depth of the opening formed in the film EF is deep, the pulse NP of a negative voltage having a relatively high absolute value is supplied to the lower electrode 18, and the film EF is etched by using the ions having relatively high energy.

In a case where the duty ratio of the pulse NP that is periodically applied has a tendency to decrease, the etching rate of the mask MK decreases according to the progress of the etching of the film EF. Therefore, the selectivity of the etching of the film EF with respect to the etching of the mask MK is enhanced. Further, in a case where the duty ratio of the pulse NP is reduced to have a ratio of 15% or more and 20% or less, it becomes possible to further suppress the etching of the mask MK while suppressing a decrease in the etching rate of the film EF.

While various exemplary embodiments have been described above, various additions, omissions, substitutions and changes may be made without being limited to the exemplary embodiments described above. Elements of the different embodiments may be combined to form another embodiment.

For example, a first period and a second period are alternately repeated, and the power level of the radio frequency power HF in the second period may be set to be lower than the power level of the radio frequency power HF in the first period. In the second period, the power level of the radio frequency power HF may be set to zero. That is, the supply of the radio frequency power HF may be stopped in the second period. Further, the absolute value of the voltage of the pulse NP that is periodically applied in the second period may be set to be lower than the absolute value of the voltage of the pulse NP that is periodically applied in the first period. The application of the pulse NP may be stopped in the second period. In a case where the film that is etched in the method MT is a silicon oxide film, the reciprocal of the time length of one cycle that includes the first period and the second period, that is, a pulse frequency may be 2 kHz. In a case where the film that is etched in the method MT is a silicon nitride film, the pulse frequency may be 5 kHz or higher and 10 kHz or lower.

Further, in the method MT, as long as one or more parameters of the pulse NP that is periodically applied to the lower electrode of the substrate support can be changed, any plasma processing apparatus may be used. As such a plasma processing apparatus, an inductively coupled plasma processing apparatus, an electron cyclotron resonance (ECR) plasma processing apparatus, or a plasma processing apparatus that generates plasma by using surface waves such as microwaves is exemplified.

Hereinafter, various experiments performed for the evaluation of the method MT will be described. The present disclosure is not limited by these experiments.

(First Experiment)

In a first experiment, the method MT was applied to a plurality of sample substrates that are the same as the substrate W shown in FIG. 2 by using the plasma processing apparatus 1. In each of the sample substrates, the mask MK was a mask formed from a polycrystalline silicon film. The film FA was a silicon oxide film, and the film FB was a silicon nitride film. In the first experiment, the films EF of the plurality of sample substrates were etched under the conditions that the etching time (the time length in step ST2) and the absolute value of the negative direct-current voltage of the pulse NP are different. Other conditions of step ST1 and step ST2 are shown below.

Figure 6:
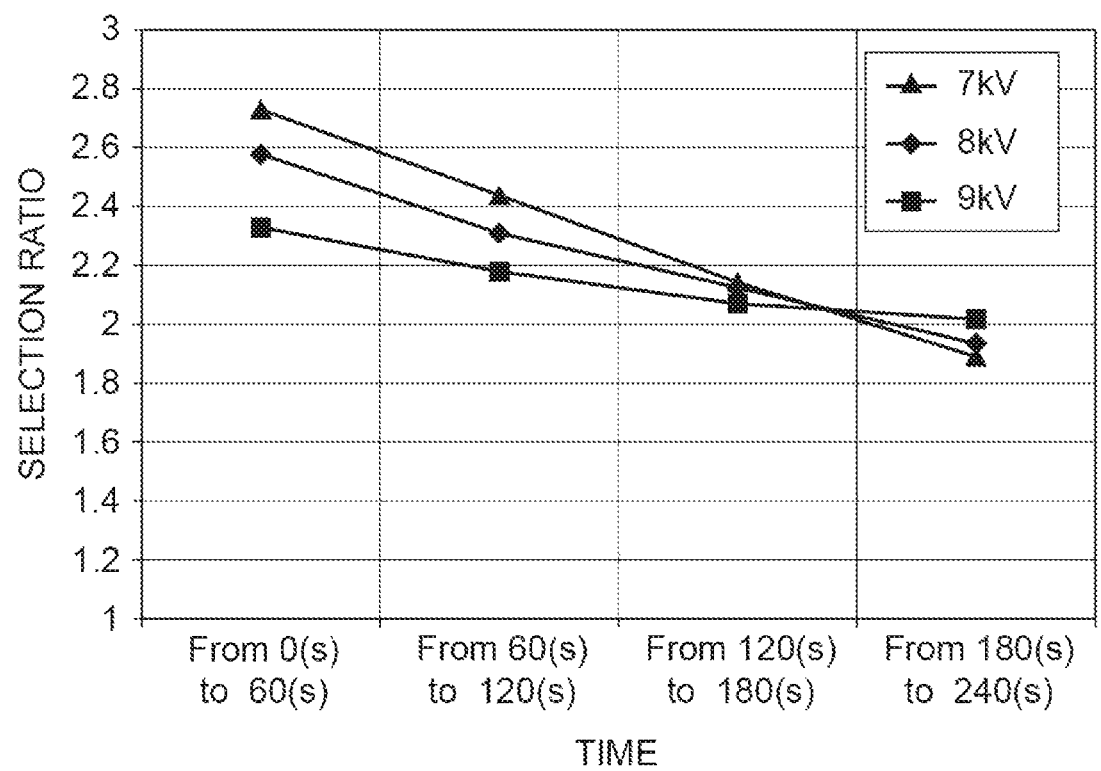
FIG. 6 is a graph showing a relationship between four time intervals and a selection ratio obtained in a first experiment.

<Conditions of Step ST1 and Step ST2>
Radio frequency power HF: 40 MHz, 1500 W
Second frequency of pulse NP: 400 kHz
Duty ratio of pulse NP: 15%
Processing gas: mixed gas that includes a fluorocarbon gas, an $O_2$ gas, and an argon gas In the first experiment, the selection ratios in four time intervals from the start of etching were obtained from the etching result of the film EF of each sample substrate. The four time intervals were a time interval from 0 seconds to 60 seconds, a time interval from 60 seconds to 120 seconds, a time interval from 120 seconds to 180 seconds, and a time interval from 180 seconds to 240 seconds with the point in time of the start of etching as a reference. The selection ratio was obtained by dividing the etching rate of the film EF by the etching rate of the mask MK. The relationship between the four time intervals and the selection ratio is shown in FIG. 6. As shown in FIG. 6, when the elapsed time from the start of etching is short, that is, when the opening formed in the film EF is shallow, it was confirmed that a high selection ratio was obtained by using the pulse NP of a negative direct-current voltage having a small absolute value. Further, when the elapsed time from the start of etching is long, that is, when the opening formed in the film EF is deep, it was confirmed that a high selection ratio was obtained by using the pulse NP of a negative direct-current voltage having a large absolute value. From this, it was confirmed that a high selection ratio could be obtained by increasing the absolute value of the voltage of the pulse NP at least once such that the absolute value of the voltage of the pulse NP has a tendency to increase, in step ST2.

Figure 7:
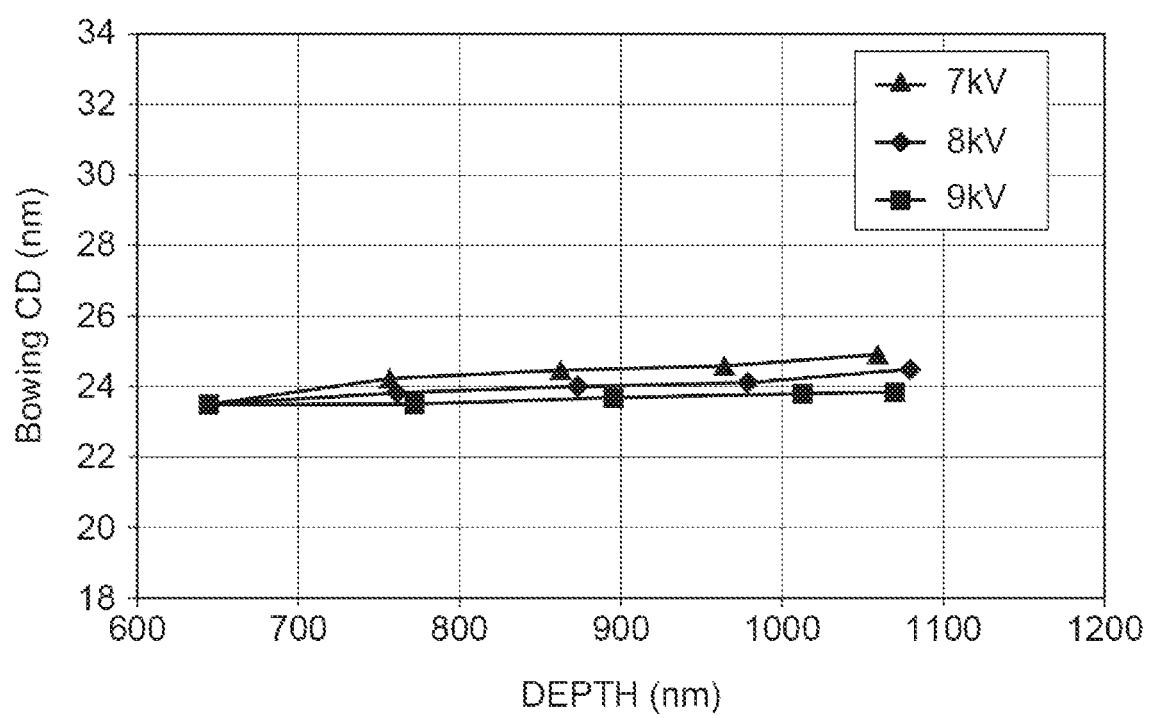
FIG. 7 is a graph showing a relationship between a depth of an opening formed in a film EF and the maximum width of an opening in a film FB obtained in the first experiment.
Figure 8:
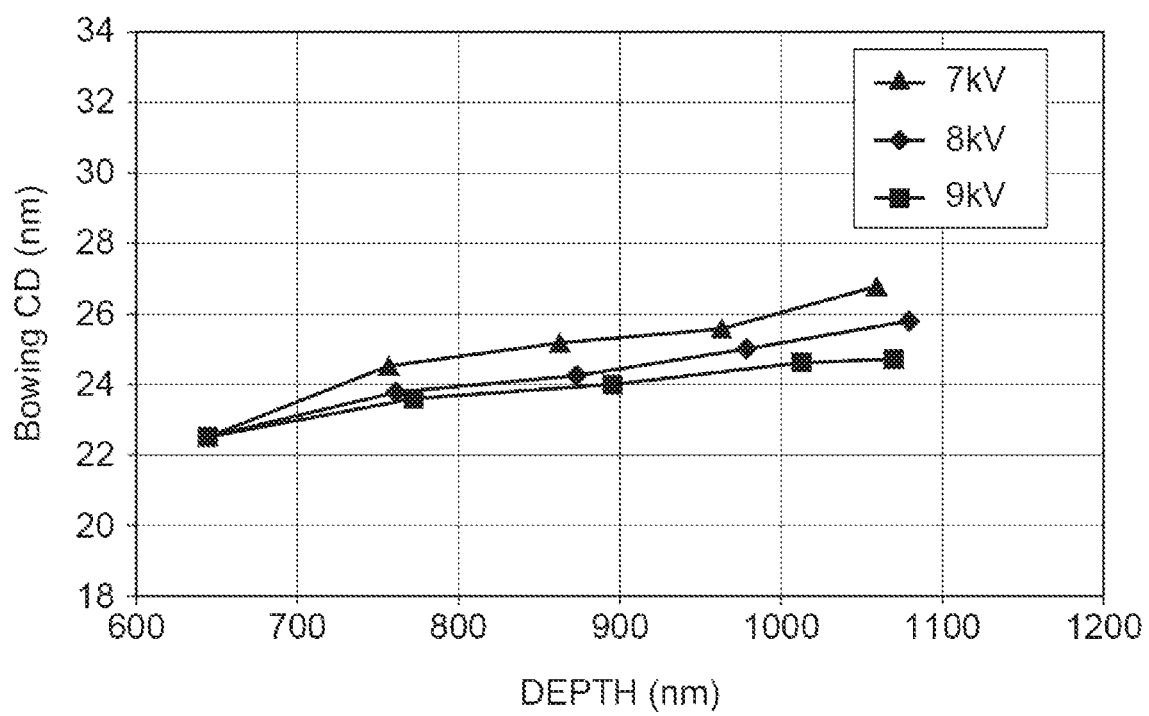
FIG. 8 is a graph showing a relationship between the depth of the opening formed in the film EF and the maximum width of an opening in a film FA obtained in the first experiment.

Further, in the first experiment, from the etching result of the film EF of each sample substrate, the relationship between the depth of the opening formed in the film EF and each of the maximum width (Bowing CD) of the opening in the film FA and the maximum width (Bowing CD) of the opening in the film FB was obtained. FIG. 7 is a graph showing the relationship between the depth of the opening formed in the film EF and the maximum width (Bowing CD) of the opening in the film FB. FIG. 8 is a graph showing the relationship between the depth of the opening formed in the film EF and the maximum width (Bowing CD) of the opening in the film FA. As shown in FIGS. 7 and 8, when the depth of the opening formed in the film EF was shallow, the dependence of the Bowing CD of each of the film FA and the film FB on the absolute value of the voltage of the pulse NP was small. When the depth of the opening formed in the film EF was deep, the larger the absolute value of the voltage of the pulse NP was, the smaller the Bowing CD of each of the film FA and the film FB became. From this, it was confirmed that the high selection ratio and the high verticality of the opening of the film EF could be obtained by increasing the absolute value of the voltage of the pulse NP at least once such that the absolute value of the voltage of the pulse NP has a tendency to increase, in step ST2.

(Second Experiment)

In a second experiment, the method MT was applied to a plurality of sample substrates by using the plasma processing apparatus 1. Each of the plurality of sample substrates used in the second experiment was a sample substrate having the same configuration as the sample substrate used in the first experiment. In the second experiment, the films EF of the plurality of sample substrates were etched under the conditions that the absolute value of the voltage of the pulse NP and the duty ratio are different. Other conditions of step ST1 and step ST2 are shown below.

Figure 9:
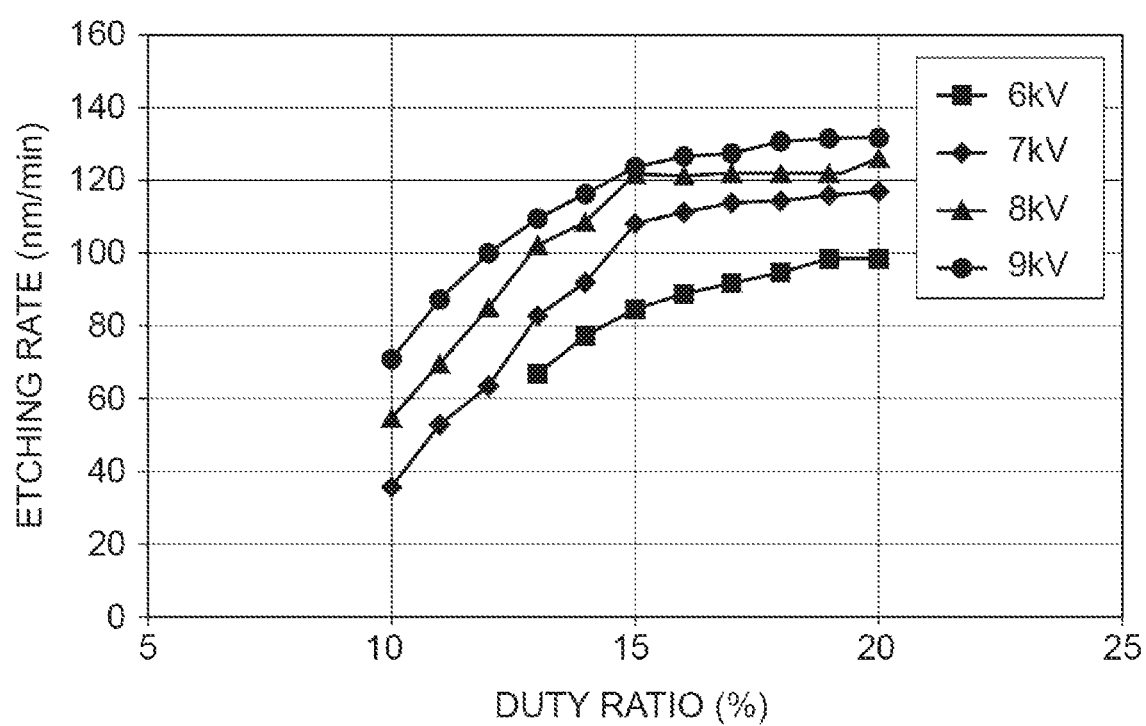
FIG. 9 is a graph showing a relationship between a duty ratio of a pulse NP and an etching rate of the film FA obtained in the first experiment.
Figure 10:
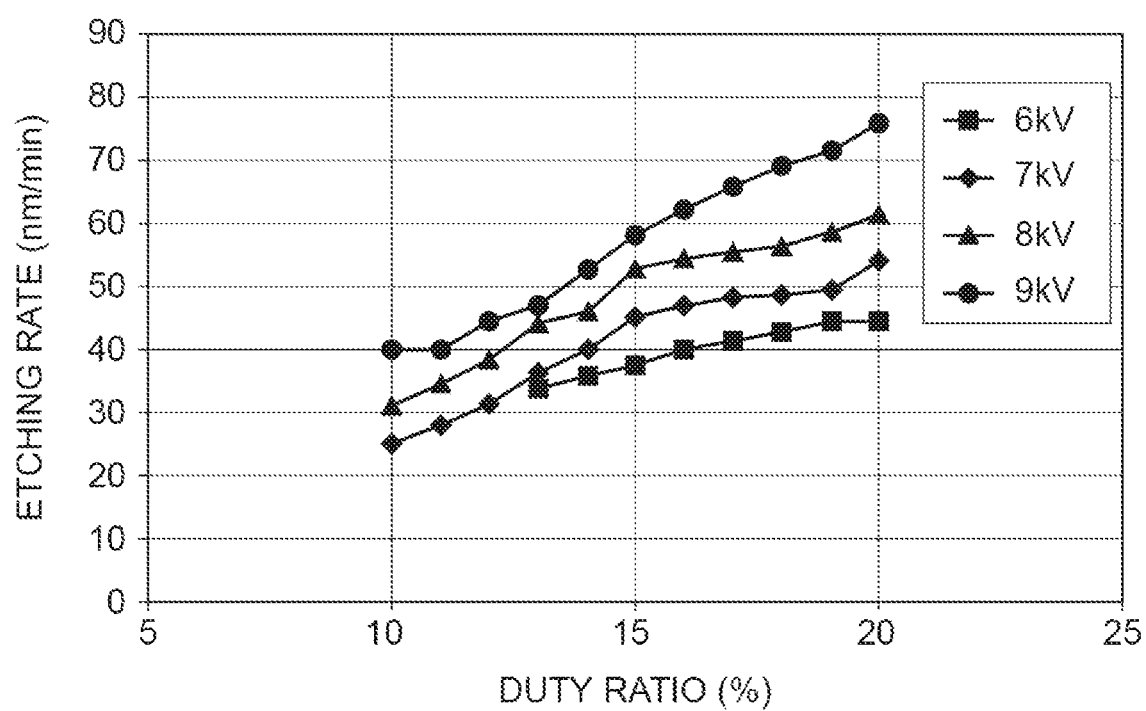
FIG. 10 is a graph showing the relationship between the duty ratio of the pulse NP and an etching rate of a mask MK obtained in the first experiment.

<Conditions of Step ST1 and Step ST2>
Radio frequency power HF: 40 MHz, 1500 W
Second frequency of pulse NP: 400 kHz
Processing gas: mixed gas that includes a fluorocarbon gas, an $O_2$ gas, and an argon gas In the second experiment, from the etching results of the plurality of sample substrates, the relationship between the duty ratio of the pulse NP and each of the etching rate of the film FA and the etching rate of the mask MK was obtained. FIG. 9 shows the relationship between the duty ratio of the pulse NP and the etching rate of the film FA. FIG. 10 shows the relationship between the duty ratio of the pulse NP and the etching rate of the mask MK. As shown in FIG. 10, the etching rate of the mask MK decreased according to a decrease in the duty ratio of the pulse NP. As shown in FIG. 9, a decrease in the etching rate of the film FA according to a decrease in the duty ratio of the pulse NP was small as long as the duty ratio of the pulse NP was decreased in the range from 20% to 15%. Therefore, it was confirmed that the selectivity was increased in a case where the duty ratio of the pulse NP that is periodically applied has a tendency to decrease. Further, in a case where the duty ratio of the pulse NP is reduced to have a ratio of 20% or more and 15% or less, it was confirmed that it became possible to further suppress the etching of the mask MK while suppressing a decrease in the etching rate of the film EF.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
   placing a substrate on a substrate support provided in a chamber of a plasma processing apparatus, the substrate having a film and a mask provided on the film; and
   etching the film of the substrate placed on the substrate support, said etching the film including
   (a) generating plasma of a processing gas in the chamber, and
   (b) etching the film by supplying ions from the plasma to the substrate by periodically applying a pulse of a voltage to a lower electrode in the substrate support,
   wherein in said (b), a level of a voltage of the pulse is changed at least once such that an absolute value of a negative potential of the substrate has a tendency to increase according to progress of etching of the film.

2. The etching method according to claim 1, wherein the pulse is a pulse of a negative voltage or a pulse of a negative direct-current voltage, and
   in said (b), an absolute value of the voltage of the pulse is increased at least once such that the absolute value of the voltage of the pulse has a tendency to increase according to the progress of the etching of the film.

3. The etching method according to claim 1, wherein in said (b), a duty ratio of the pulse is set to 20% or less.

4. The etching method according to claim 1, wherein in said (b), a duty ratio of the pulse is decreased at least once to have a tendency to decrease according to the progress of the etching of the film.

5. The etching method according to claim 4, wherein in said (b), the duty ratio of the pulse is decreased to have a ratio of 15% or more and 20% or less.

6. The etching method according to claim 4, wherein in said (b), the duty ratio of the pulse is stepwise or gradually reduced.

7. The etching method according to claim 1, wherein in said (b), the level of the voltage of the pulse is stepwise or gradually changed.

8. An etching method comprising:
   placing a substrate on a substrate support provided in a chamber of a plasma processing apparatus, the substrate having a film and a mask provided on the film; and
   etching the film of the substrate placed on the substrate support, said etching the film including
   (a) generating plasma of a processing gas in the chamber of the plasma processing apparatus, and
   (b) etching the film by supplying ions from the plasma to the substrate by periodically applying a pulse of a voltage to a lower electrode in the substrate support,
   wherein in said (b), a duty ratio of the pulse is decreased at least once to have a tendency to decrease according to progress of the etching of the film.

9. The etching method according to claim 8, wherein the pulse is a pulse of a negative voltage or a pulse of a negative direct-current voltage.

10. The etching method according to claim 1, wherein the film includes a silicon-containing film.

11. The etching method according to claim 1, wherein the film includes a silicon-containing dielectric film.

12. The etching method according to claim 1, wherein the film includes a silicon oxide film.

13. The etching method according to claim 12, wherein the film further includes a silicon nitride film.

14. The etching method according to claim 12, wherein the mask is formed of polycrystalline silicon.

* * * * *